United States Patent
Li

(10) Patent No.: US 11,017,962 B2
(45) Date of Patent: *May 25, 2021

(54) LIGHT DEVICE CONTROL APPARATUS

(71) Applicant: LEEDARSON AMERICA INC., Smyrna, GA (US)

(72) Inventor: Yongchuan Li, Smyrna, GA (US)

(73) Assignee: LEEDARSON AMERICA INC., Smyrna, GA (US)

( * ) Notice: Subject to any disclaimer, the term of this patent is extended or adjusted under 35 U.S.C. 154(b) by 0 days.

This patent is subject to a terminal disclaimer.

(21) Appl. No.: 16/558,976

(22) Filed: Sep. 3, 2019

(65) Prior Publication Data

US 2019/0393002 A1    Dec. 26, 2019

Related U.S. Application Data

(63) Continuation of application No. 15/807,584, filed on Nov. 9, 2017, now Pat. No. 10,446,339.

(51) Int. Cl.
| | |
|---|---|
| *H01H 9/02* | (2006.01) |
| *H01H 9/54* | (2006.01) |
| *H03K 17/96* | (2006.01) |
| *H05B 47/19* | (2020.01) |

(52) U.S. Cl.
CPC ............ *H01H 9/0271* (2013.01); *H01H 9/54* (2013.01); *H03K 17/96* (2013.01); *H03K 17/9627* (2013.01); *H05B 47/19* (2020.01); *H01H 2300/03* (2013.01)

(58) Field of Classification Search
CPC .... H01H 9/0271; H01H 9/54; H01H 2300/03; H01H 9/02; H05B 47/19; H03K 17/96; H03K 17/9627

See application file for complete search history.

(56) References Cited

U.S. PATENT DOCUMENTS 10,446,339 B2 * 10/2019 Li ..................... H01H 9/0271

* cited by examiner

*Primary Examiner* — Robert L Deberadinis
(74) *Attorney, Agent, or Firm* — Chun-Ming Shih; Lanway IPR Services

(57) ABSTRACT

A light device control apparatus is designed to pair with a traditional switch device that has a traditional switch for accepting a first user manual operation to control a target device connected to the traditional switch device with an electrical wire. The traditional switch device has a connecting structure. The light device control apparatus has an attaching device, a cover body, a replacement switch and a wireless controller. The attaching device is attached to the connecting structure of the traditional switch device. The wireless controller wirelessly controls the target device. The replacement switch and the wireless component are not overlapped to each other vertically with respect to the surface cover of the traditional switch device.

20 Claims, 15 Drawing Sheets

LIGHT DEVICE CONTROL APPARATUS

RELATED APPLICATION

The present invention is a continued application of U.S. patent application Ser. No. 15/807,584.

FIELD OF INVENTION

The present invention relates to a retrofit switch and more particularly related to a retrofit switch capable of wirelessly controlling a target device.

BACKGROUND

IoT (Internet of Things) technologies are developed rapidly and various devices are invented for making human life more convenient. For example, wireless speakers, door locks, lights are easily controlled by a mobile phone via Bluetooth today.

Meanwhile, there are many traditional devices like lamp or downlight installed in a conventional house. It would be very helpful if certain innovative modifications are provided to turn these traditional devices into a controllable IoT network device.

SUMMARY OF INVENTION

According to a first embodiment of the present invention, a retrofit switch apparatus is designed to be attached to a traditional switch device. The traditional switch device is fixed to an environment surface like a wall. The traditional switch device has a traditional switch and a traditional switch surface cover. The traditional switch has a protruding portion extended above the traditional switch surface cover. The traditional switch device being used for receiving a first user manual operation to control a target device like a downlight connected to the traditional switch device via an electrical wire. The retrofit switch apparatus has a cover body, a replacement switch and a wireless controller.

The cover body has a storing space for containing and covering the traditional switch to keep the traditional switch in a default operation mode. In other words, when the traditional switch is covered by the retrofit switch apparatus, a user would not accidently turn off the power supply to the target device, which may cause the wireless controller in the target device losing function.

A replacement switch is disposed at a first end of the cover body. The replacement switch is used for receiving a second user manual operation. The second user manual operation may be the same as the first user manual operation in functions, operation modes and may have additional function or operation modes compared with the traditional switch. The second user manual operation is performed by the wireless controller, not the original traditional switch connecting to the target device via the connection wire.

The wireless controller is disposed at a second end of the cover body. The wireless controller is electrically directly or indirectly connected to the replacement switch for converting the second user operation to a wireless control command to control the target device. For example, the replacement switch may use optical, mechanical, electronic or other methods for receiving user operations. The wireless controller receives the operation result by sensor, a signal line or any other approaches.

In some embodiments, the first end where the replacement switch is disposed and the second end where the replacement switch is disposed are at opposite ends of the cover body. In other words, in such embodiments, the replacement switch and the wireless controller are placed at two different and opposite ends of the cover body. This would help minimizing the height during design and make the overall design more balance.

In some embodiments, the first end where the replacement switch is disposed is at center portion of the cover body, and the second where the replacement switch is disposed is at peripheral area with respect to center portion of the cover body. In such embodiments, the replacement switch is in the middle of the cover body while the wireless controller is located at peripheral area away from the middle area of the cover body so as to prevent damage to the wireless controller which may contain sensitive circuits. With such design, the reliability and life span is increased.

In some embodiments, the replacement switch has two buttons respectively located at two opposing peripheral areas of the cover body and the wireless controller is located in the central portion of the cover body. In such embodiments, the wireless controller is still distant, in certain way, from the two buttons.

In some embodiments, the replacement switch has a mechanical switch connected to the wireless controller with a signal line. In other words, the wireless component does not need to be disposed under the replacement switch. Instead, the wireless component may be disposed away from the replacement switch but still is able to receive necessary operation signal.

In some embodiments, the replacement switch has a switch circuit for converting the second user manual operation to an electrical signal transmitted to the wireless controller via the signal line. In other words, the replacement switch may have a mechanical portion, an electronic portion like a touch area, and also have related circuits to translate user operations into electronical signal that may be transferred to the wireless controller to be used for controlling the target device.

In some embodiments, the wireless controller has a module housing to be integrated to the cover body and the wireless controller is detachable from the cover body so that the wireless controller with the same module housing matches to different sizes and types of the cover bodies corresponding to different traditional switch devices. In other words, the wireless controller may be manufactured as a standard module to match different cover body containing one or more replacement switches corresponding to different traditional switch devices. During installation, a user only needs to install the wireless controller into the matched cover body to match any specific type of traditional switch device. In such design, the wireless controller may be installed from top side. It would be also a benefit to arrange the wireless controller not overlapping the replacement switch on the cover body to more easily implement such design.

In some embodiments, the cover body has a slot for receiving the module housing, and the slot is arranged horizontally neighboring to the replacement switch with respect to the environment surface instead of overlapping with the replacement switch vertically. In other words, such wireless controller module may be installed into the slot, which is convenient and flexible.

In some embodiments, the replacement switch is arranged horizontally neighboring to the wireless controller with respect to the environment instead of overlapping to the wireless controller vertically. There may be certain distance between the replacement switch and the wireless controller. In such embodiments, the wireless controller is not under the replacement switch.

In some embodiments, the cover body has a bottom part and a top part. The replacement switch is disposed at the top part and the bottom part is attached to the traditional switch surface cover. The bottom part has a plurality of supporting walls defining the storing space for covering the traditional switch so as to keep the traditional switch not operated by a user when the traditional switch is covered in the storing space. In other words, the walls define the storing space for covering the traditional switch.

In some embodiments, the replacement switch has a light guide component to detect the second user manual operation. A sensor is used with the light guide component to convert the second user manual operation to the wireless controller to control the target device. Such light guide component is used as part of an optical switch, which may be more reliable compared with pure mechanical and electrical switch. An LED light is transmitted and detection of whether such light signal is changed is used for determining whether a predetermined operation is performed by a user.

In some embodiments, the replacement switch has two buttons corresponding two operation modes of the target device. The two buttons change a status of the light guide component when the two buttons are pressed. With such design, the operation of the user is collected and responded by the wireless controller.

In some embodiments, the replacement switch may further have one ore more silicon dioxide components corresponding to buttons to detect the second user manual operation and to make the pressing more comfortable and to prevent damage of the buttons. A decoder is used with the silicon dioxide component to convert the second user manual operation to the wireless controller to control the target device.

In some embodiments, the replacement switch has two buttons corresponding two operation modes of the target device. The two buttons correspond to two silicon dioxide components to generate signals corresponding associated to the second user manual operations when the two buttons are pressed.

In some embodiments, the retrofit switch apparatus also has a circuit board for supporting the wireless controller and a switch circuit arranged horizontally with respect to the environment surface and without overlapping with each other. In other words, the wireless controller and the components of the replacement switch are not overlapped.

In some embodiments, there is a hole in the middle of the circuit board so that a portion of the traditional switch extends through the hole of the circuit board. This is particularly helpful to design a standard retrofit switch apparatus to be compatible with different size and types of traditional switch.

In some embodiments, the retrofit switch apparatus also has a hinge between the top part and the bottom part so that the top part is operable to be rotated with respect with the bottom part to change a battery of the wireless controller. In other words, the top part may be rotated with respect to the bottom part to expose the inside portion of the top part to a user when necessary.

In some embodiments, when the top part is rotated, the traditional switch is exposed to a user so that the user is able to control the traditional switch. When the top part is rotated, it is also easier to change a battery of the wireless controller.

In some embodiments, the wireless controller is electrically disconnected from the traditional switch device. In other words, the retrofit switch apparatus is attached to the traditional switch device but does not get electrical contact with the power source connecting to the traditional switch device.

In some embodiments, the traditional switch device may have a mode switch. When the retrofit switch apparatus is attached to the traditional device, the mode switch is activated so that the target device is kept supplied with electricity via the traditional switch device. Such mode switch may be a mechanical lever or an electronic signal receiver. When the retrofit switch is attached to the traditional switch device, the mode switch of the traditional switch device is activated so that the traditional switch device may change its behavior. For example, even a user switches the traditional switch, the target device may still be kept providing electrical current.

Another objective of the present invention is to provide a retrofit switch apparatus. In an embodiment, the retrofit device is attached to a traditional switch device. The traditional switch device is fixed to an environment surface like a wall. The traditional switch device may also be fixed to other surface like a table, a cabin, car housing and any other devices that traditionally has traditional switch. Examples of such traditional switch includes but not limited to in-wall switches like On/Off Switches, keypads, digital switches, occupancy sensing switches, push-button switches, dimming switches such as rotary dimmers, slide dimmers, digital dimmers, and step dimmers.

Such traditional switch device has a traditional switch mounted on a traditional switch cover surface for accepting a first user manual operation to control a target device. The target device may be a light, an air conditioner, a fan or any other electrical device connected to the traditional switch device with an electrical wire. In some embodiments, such electrical wire is embedded behind a wall. The traditional switch device also has a connecting structure.

The retrofit switch apparatus has an attaching device, a retrofit housing and a control circuit.

The attaching device is used for attaching to the connecting structure of the traditional switch device. The retrofit housing is connected to the attaching device. The control circuit is connected to the retrofit housing for wirelessly controlling the target device. For example, the control circuit may support Bluetooth, ZigBee, Wi-Fi or other wireless communication standard or customized communication protocols.

In some embodiments, the connecting structure is a socket and the attaching device has a pin to plug into the socket. Such connecting structure may be a standard electrical socket that may be found in most houses for providing electrical power to electric devices. In such case, the attaching device may be a standard electrical plug, i.e. having two or more metal plugs associated to standard electrical sockets.

In some embodiments, the attaching device further forwards electrical power from the connecting device to the control circuit when the retrofit switch apparatus is attached to the traditional switch device. With such arrangement, the control circuit has reliable and constant power supply and users do not need to worry to replace batteries for the retrofit switch apparatus.

In some embodiments, the connecting structure is a standard USB socket and the attaching device has a corresponding USB plug to plug into the standard USB socket. In other words, a regulated DC current is provided by the traditional switch device. This saves cost of the design of the retrofit switch apparatus.

In some embodiments, the connecting structure has a first hook structure and the attaching device is a second hook structure corresponding to the first hook structure for hooking the retrofit switch apparatus to the traditional switch device while remaining detachable connection relation. Various hook structures may be designed and all such variations including different pairing structures should be regarded within the invention scope. For example, plugs and associated grooves or sockets may be provided for forming such hook structures. Such hook structures may be designed so that users may easily take the retrofit switch apparatus away from the traditional switch device. Certain fixing level may also be applied to make it more difficult to un-hook the retrofit device from the traditional switch device.

In some embodiments, the retrofit housing exposes the traditional switch. Meanwhile, while the retrofit switch apparatus is connected to the traditional switch device, the traditional switch is disabled even when the traditional switch is operated by a user. The may be achieved by mechanical structure or electrical structure. For example, a sensor may be applied to detect existence of the retrofit switch apparatus. The function of the traditional switch may be disabled, i.e. not effect for operation thereof. Mechanical structures may be designed in the traditional switch device by physically triggering disabling function when the connecting device is attached with the attaching device.

In some embodiments, the attaching device changes operation mode of the traditional switch device to disable the traditional switch when the attaching device is connected to the traditional switch device.

In some embodiments, the traditional switch device may have a disabling switch to disable the traditional switch even when the traditional switch is operated by a user. For example, a toggle button may be disposed on the traditional switch device.

In some embodiments, the retrofit housing hides the traditional switch so that the traditional switch is not operated when the retrofit switch apparatus is connected to the traditional switch device. In other words, the retrofit housing prevents a user to touch the traditional switch so that to prevent accidently turning off power supply to the target device on which a control circuit may needs such power supply to work normally.

In some embodiments, the attaching device may have a rotating device for rotating the retrofit housing with respect to the traditional switch device. For example, a rotating hinge may be used for rotate the retrofit housing with respect to the traditional switch device. The attaching device may be a bracket fixed on the traditional switch device and contains an axis for connecting a portion of the retrofit housing so that a user may rotate the retrofit housing with respect to the traditional switch device.

With such design, the retrofit switch device may have a battery box. When the retrofit housing is rotated with respect to the traditional switch device, the battery box is facing to a user for the user to replace a battery in the battery box.

With such design, when the retrofit housing is rotated with respect to the traditional switch device, the traditional switch may be exposed to a user for the user to operate the traditional switch. This is very important because with such design, a user may easily operate the traditional switch in accident scenario, in the case which a user wants to replace a bulb of the target device, or in the case that the retrofit switch apparatus functions abnormally.

In some embodiments, the traditional switch cover surface has a standard electrical socket and the attaching device has a standard electrical plug to plug into the standard electrical socket. It is common to find such traditional switch in various houses. Or ore two light switches together with one or two standard electrical sockets are integrated as a traditional switch device placed on a wall. In such case, the retrofit switch apparatus is plugged into the electrical socket to attach the retrofit switch apparatus overlapping and covering the original traditional switch on the wall. Meanwhile, the retrofit switch apparatus may include an external standard electrical socket exposed on the retrofit housing for forwarding electrical power from the standard electrical socket of the traditional switch device. In other words, the retrofit switch device may get power supply from the electrical socket and may simply forwards the electrical power to another device plugging into the electrical socket on the retrofit switch apparatus.

In some embodiments, the control circuit is embedded in a control module. The control module is separable from the main body of the retrofit housing. For example, a reception hole is disposed for receiving the control module. With such design, manufacturers may produce the same control modules while pairing such control modules to different retrofit housings to fit different traditional switch device types. Such design saves a lot of manufacturing cost while keeping strong flexibility.

In some embodiments, the control module may include a touch surface for receiving a touch operation from a user to operate the control circuit. For example, variable types of capacitor or resistor touch devices may be used in such embodiments.

In some embodiments, the control module may be disposed with electrical connectors to be connected to a corresponding structure on the retrofit housing to receive power supply from a battery or from the traditional switch device.

Another aspect of the present invention is to provide a traditional switch apparatus for connecting to the retrofit switch apparatuses mentioned above. Such traditional switch apparatus has a similar appearance like convention switch device but new features as mentioned above. Such traditional switch apparatus has a traditional switch and a connecting structure for connecting to the attaching device of the retrofit switch apparatus as mentioned above.

In some embodiments, the connecting structure may even supply electrical power to the control circuit of the retrofit switch apparatus.

DETAILED DESCRIPTION

Figure 1:
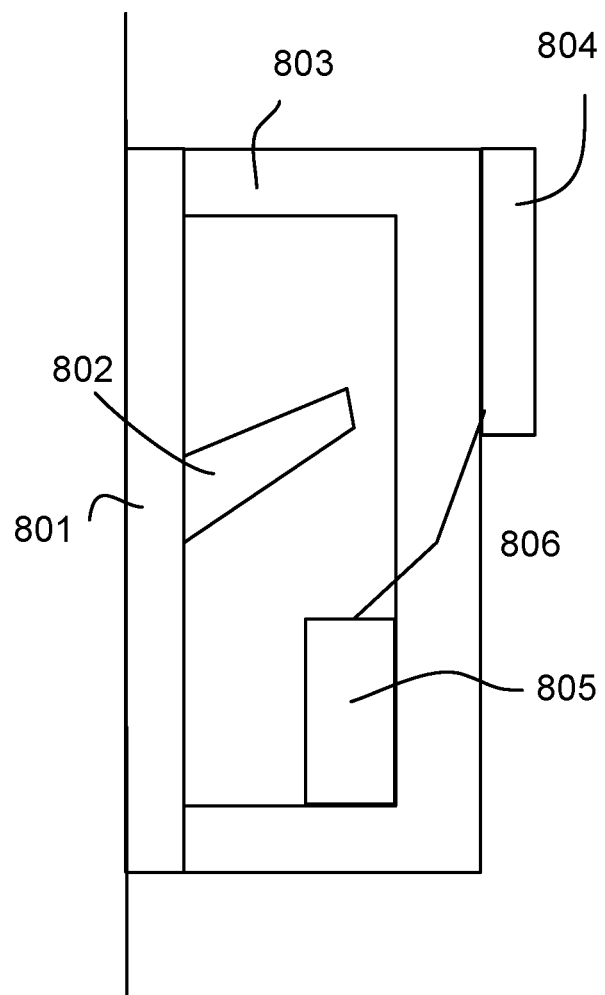
FIG. 1 illustrates an embodiment of a retrofit switch apparatus.

Please refer to FIG. 1, which illustrates an embodiment of a retrofit switch apparatus of the present invention.

The retrofit switch apparatus has a cover body 803, a replacement switch 804, a wireless controller 805. The replacement switch 804 is connected to the wireless controller 805 via a wire 806 so that the replacement switch 804 does not need to be placed overlapping the wireless controller 805. The retrofit switch apparatus is attach to a traditional switch device 801, which has a traditional switch 802. When the retrofit switch apparatus is attached to the traditional switch device 801, the traditional switch 802 is covered by a storing space of the cover body 803. The original operation to the traditional switch device 801 is now replaced by the replacement switch 804. The wireless controller 805 translates the operation on the replacement switch 804 to control a target device like a downlight that is originally controlled by the traditional switch device 801. The target device is connected with the traditional switch device via a wire, e.g. behind a wall.

Figure 2A:
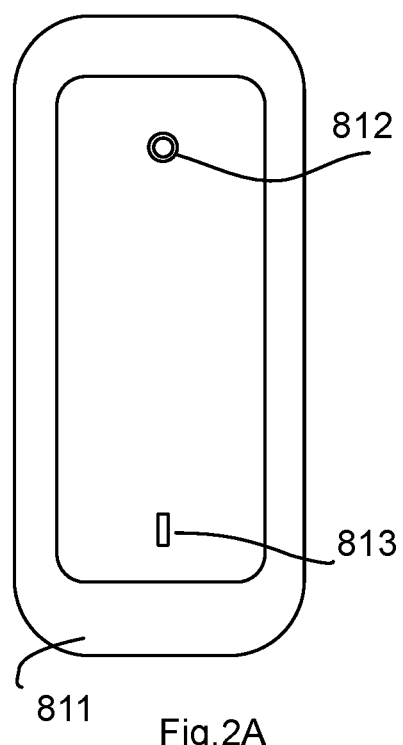
FIG. 2A and FIG. 2B illustrate two views of a retrofit switch apparatus.
Figure 2B:
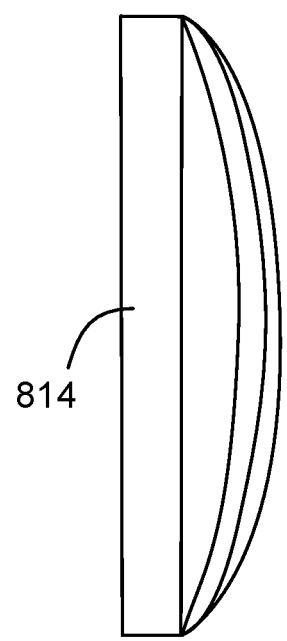

Please refer to FIG. 2A and FIG. 2B, which illustrate a top view and a side view of an embodiment of a retrofit switch apparatus. In this embodiment, the retrofit switch apparatus has two buttons 812 and 813 located on a cover body 811. The cover body 811 has a bottom part 814 to be attached to a traditional switch device.

Figure 3A:
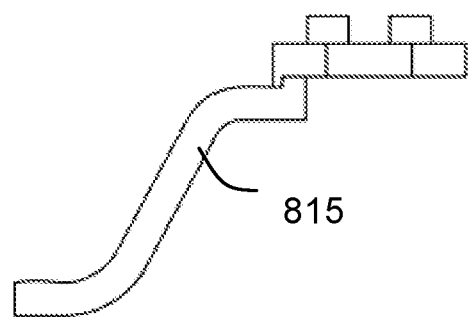
FIG. 3A and FIG. 3B illustrate a component used in the embodiment of FIG. 2A.
Figure 3B:
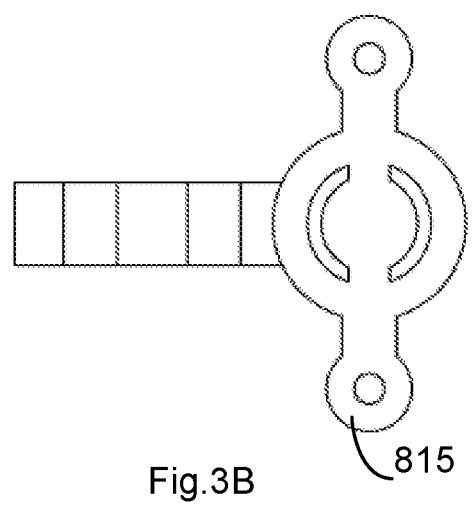

Please refer to FIG. 3A and FIG. 3B, which illustrates a light guide component 815 used in the embodiment of FIG. 2A and FIG. 2B. Such light guide component 815 may be acquired on conventional market and use optical detection to determine whether there is a user operation.

Figure 4A:
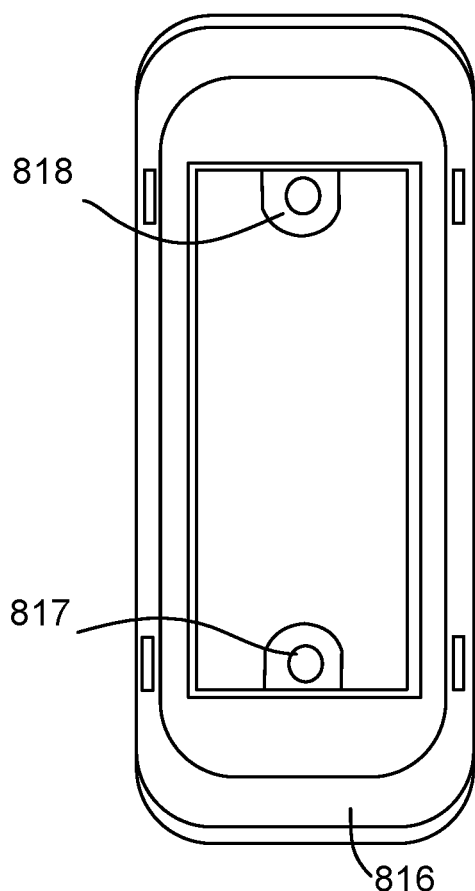
FIG. 4A and FIG. 4B illustrate two views of a retrofit switch apparatus.
Figure 4B:
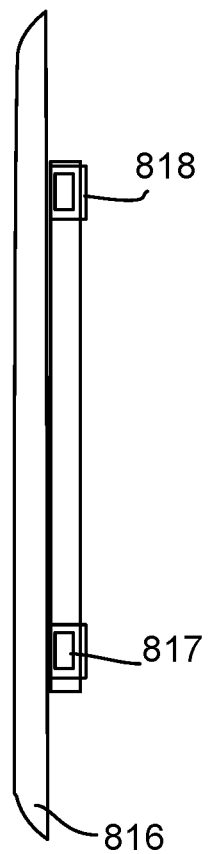

Please refer to FIG. 4A and FIG. 4B, which illustrate the bottom part of the embodiment of FIG. 2A. There are two attaching devices 817, 818. on the bottom surface 816 of the bottom part of the retrofit switch apparatus. The two attaching devices 817, 818 have related screws and grooves. However, please be noted that other ways to attach the retrofit switch apparatus to a traditional switch device are also applicable and within the invention scope.

Figure 5:
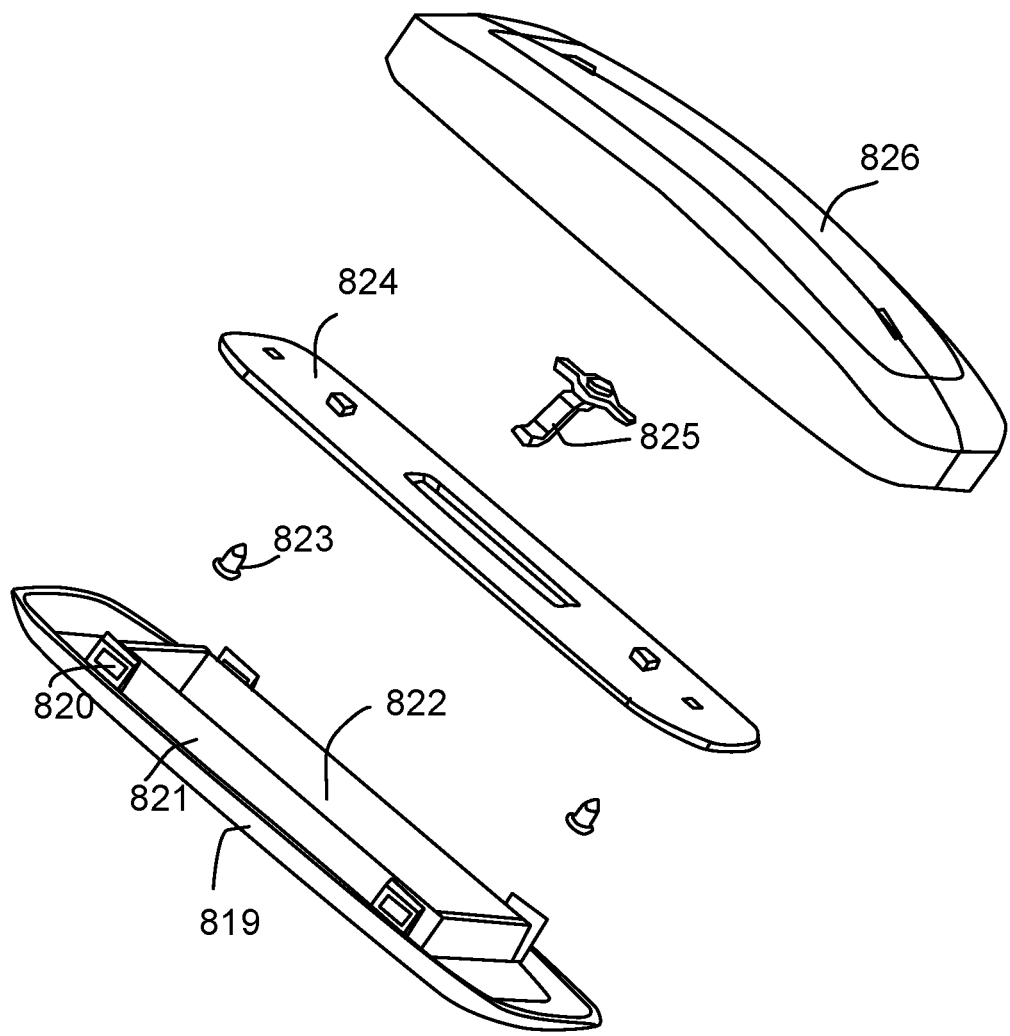
FIG. 5 illustrates an exploded view of a retrofit switch apparatus.

Please refer to FIG. 5, which illustrates components of a retrofit switch apparatus. In FIG. 5, a top part 826 with two buttons there on is to be assembled to a bottom part 819. A circuit board 824 is between the top part 826 and the bottom part 819. There are supporting walls 821 in the bottom part 819 to define a storing space to cover an attached traditional switch. The light guide component 825 is used to convert user operation to corresponding electronic signal. Screws 823 and connecting structures 820 may be used to assemble the retrofit switch apparatus.

Figure 6:
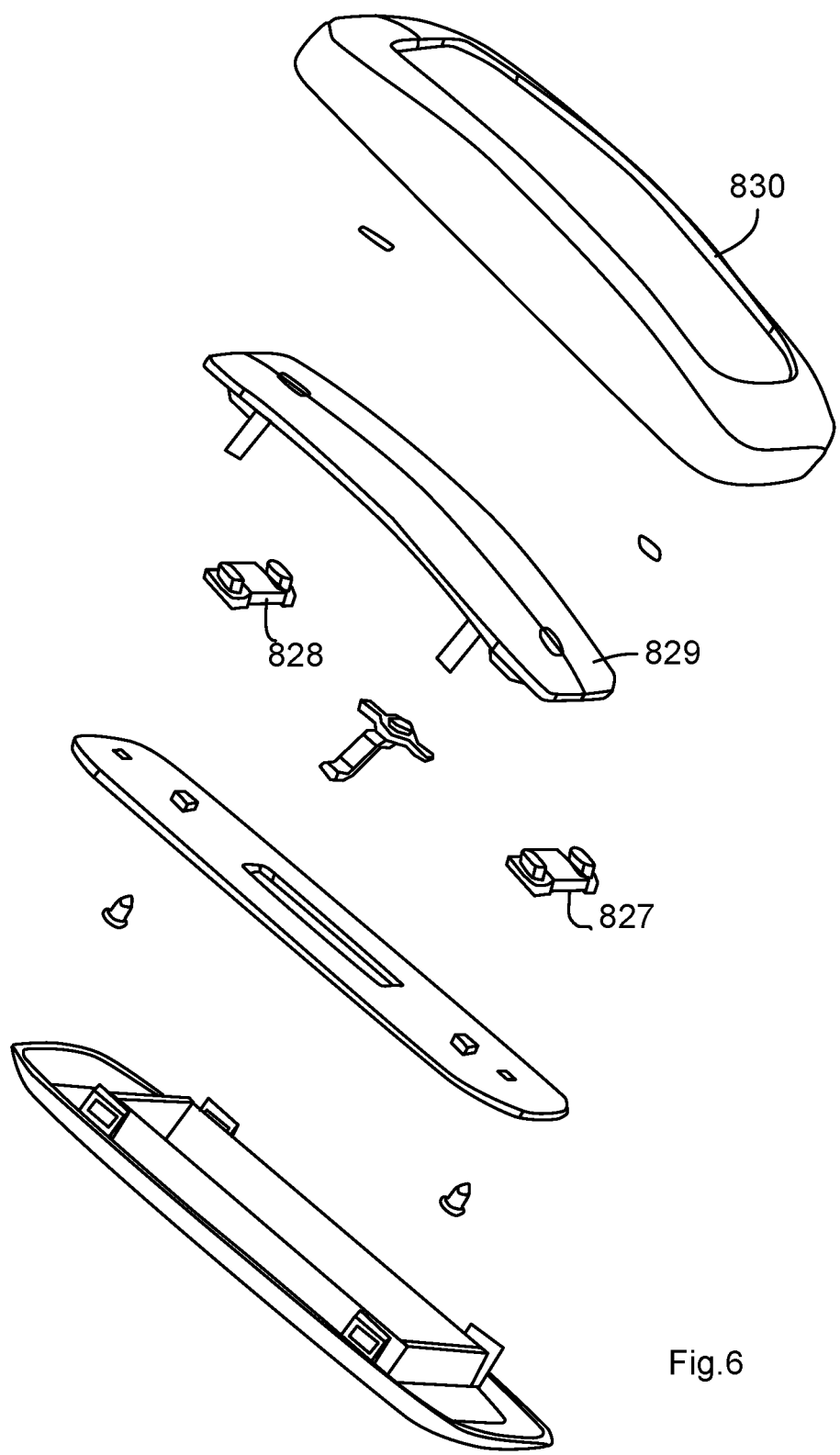
FIG. 6 illustrates an exploded view of another retrofit switch apparatus.

Please refer to FIG. 6, which illustrates another embodiment similar to the embodiment of FIG. 5. In FIG. 6, the top cover 830 is separated from the button part 829. Two silicon dioxide components 827 are added to keep button operation more smoothly.

Figure 14A:
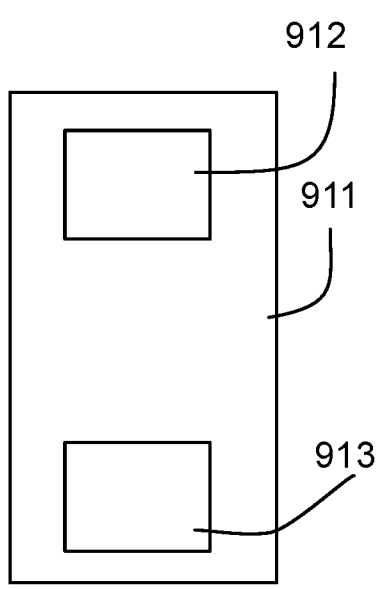
FIG. 14A illustrates an arrangement of a replacement switch and a wireless controller.
Figure 14B:
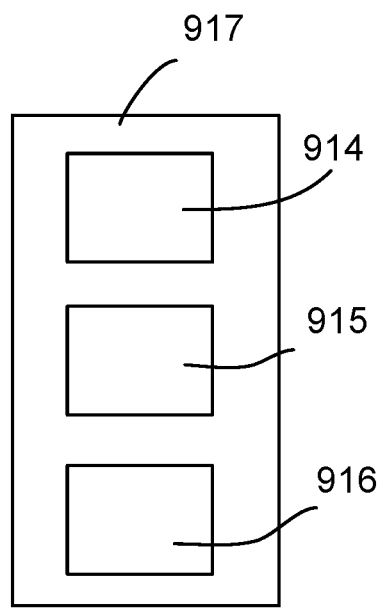
FIG. 14B illustrates another arrangement of replacement switches and a wireless controller.
Figure 14C:
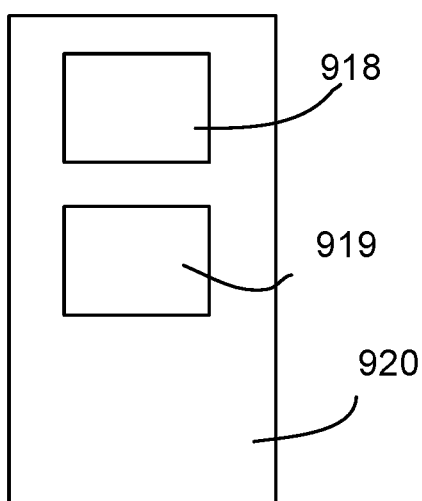
FIG. 14C illustrates another arrangement of a replacement switch and a wireless controller.

Please refer to FIGS. 14A, 14B and 14C, which illustrate some arrangement of wireless components and replacement switches.

In FIG. 14A, a replacement switch 912 and a wireless controller 913 are placed at two ends of a cover body 911 of a retrofit switch apparatus.

In FIG. 14B, two replacement switches 914, 916 are placed at two ends of a cover body 917 and a wireless component is placed at the middle of the cover body 917.

In FIG. 14C, the replacement switch 919 is placed at middle of the cover body 920. A wireless component 918 is located in peripheral portion of the cover body 920 away from the replacement switch 919.

Please be noted that other arrangement may be applied based on the claimed scopes.

Therefore, an objective of the present invention is to provide a retrofit switch apparatus. In an embodiment, the retrofit device is attached to a traditional switch device. The traditional switch device is fixed to an environment surface like a wall. The traditional switch device may also be fixed to other surface like a table, a cabin, car housing and any other devices that traditionally has traditional switch. Examples of such traditional switch includes but not limited to in-wall switches like On/Off Switches, keypads, digital switches, occupancy sensing switches, push-button switches, dimming switches such as rotary dimmers, slide dimmers, digital dimmers, and step dimmers.

Such traditional switch device has a traditional switch mounted on a traditional switch cover surface for accepting a first user manual operation to control a target device. The target device may be a light, an air conditioner, a fan or any other electrical device connected to the traditional switch device with an electrical wire. In some embodiments, such electrical wire is embedded behind a wall. The traditional switch device also has a connecting structure.

The retrofit switch apparatus has an attaching device, a retrofit housing and a control circuit.

The attaching device is used for attaching to the connecting structure of the traditional switch device. The retrofit housing is connected to the attaching device. The control circuit is connected to the retrofit housing for wirelessly controlling the target device. For example, the control circuit may support Bluetooth, ZigBee, Wi-Fi or other wireless communication standard or customized communication protocols.

In some embodiments, the connecting structure is a socket and the attaching device has a pin to plug into the socket. Such connecting structure may be a standard electrical socket that may be found in most houses for providing electrical power to electric devices. In such case, the attaching device may be a standard electrical plug, i.e. having two or more metal plugs associated to standard electrical sockets.

In some embodiments, the attaching device further forwards electrical power from the connecting device to the control circuit when the retrofit switch apparatus is attached to the traditional switch device. With such arrangement, the control circuit has reliable and constant power supply and users do not need to worry to replace batteries for the retrofit switch apparatus.

Figure 7:
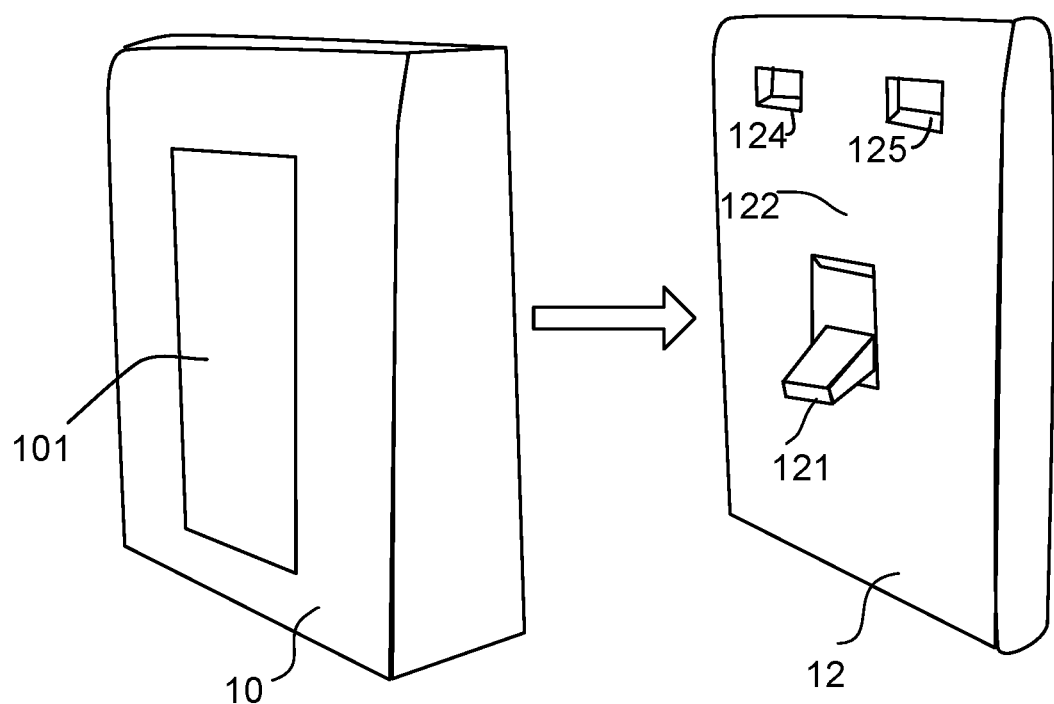
FIG. 7 illustrates attaching a retrofit switch apparatus to a traditional switch device.

Please refer to FIG. 7, which illustrates a retrofit switch apparatus 10 to be attached to a traditional switch device 12. The retrofit switch apparatus 10 may contain a switch 101 that may be the same or different from the traditional switch 121 of the traditional switch device 12. In other words, the retrofit switch apparatus 10 may be used to control the same or even different target devices as that controlled by the traditional switch device 12. In this example, there are two sockets 124, 125 disposed on the traditional switch surface cover 122 as the connecting structure of the traditional switch device 12. The retrofit switch apparatus 10 therefore is disposed with two plug structures (not shown) as the attaching device of the retrofit switch apparatus 10 corresponding to the two sockets 124, 125 and to be plugged into the two sockets 124, 125.

By connecting the attaching device to the connecting structure, the retrofit switch apparatus 10 is attached to the traditional switch device 12. The original traditional switch 121, in this example, is covered by the retrofit switch apparatus 10.

In some embodiment, the connection of the attaching device and the connecting structure provides only physical connection. But, in some other embodiments, the connection may also provide power supply to control circuits in the retrofit switch apparatus 10. There may also be more than one types of the attaching device disposed on the retrofit switch apparatus 10.

Figure 8:
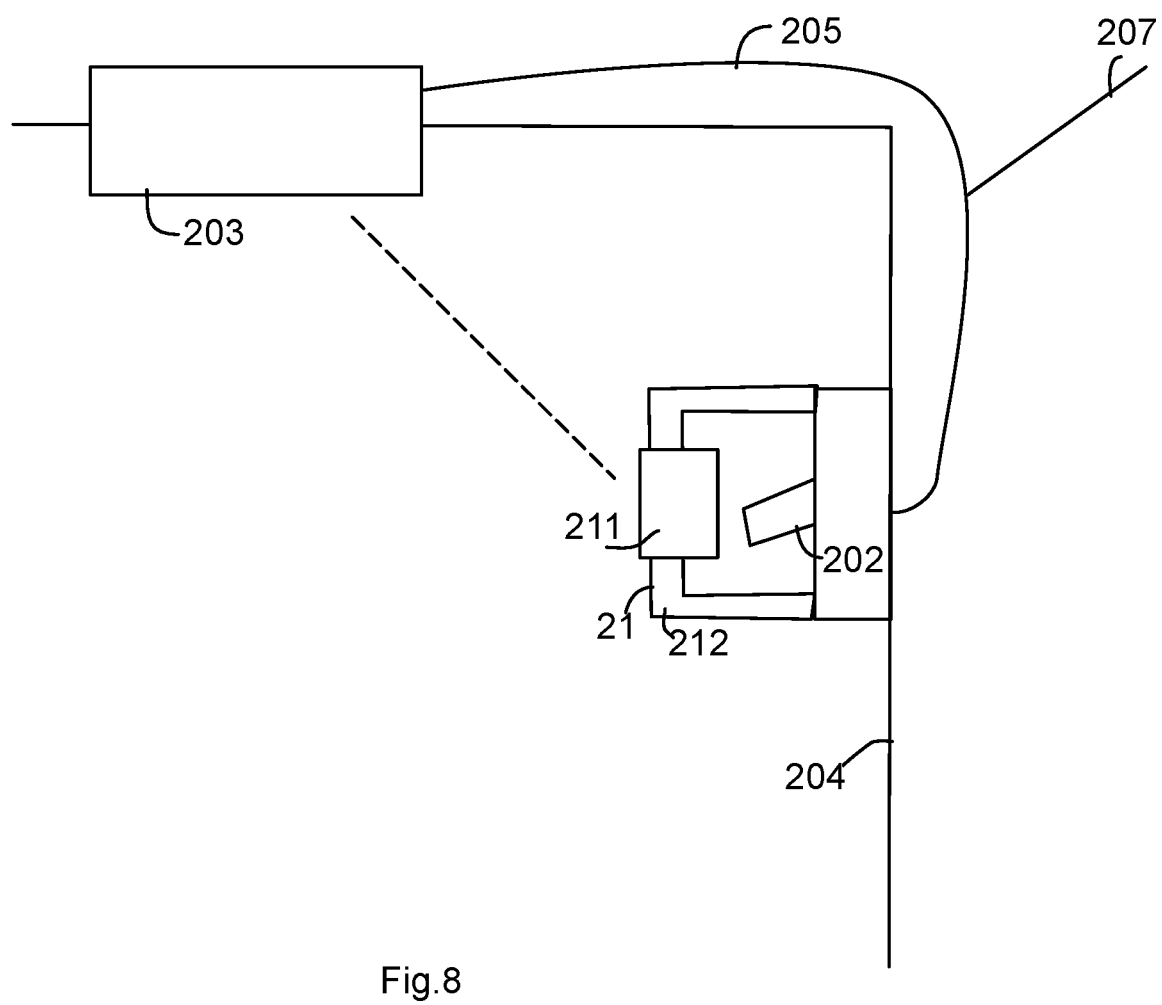
FIG. 8 illustrates relation between a switch and a target device.

Please refer to FIG. 8, which illustrates connection between components of an embodiment. A traditional switch device 202 is connected to a target device 203 via a wire 206 which is further electrically connected to a power source 207. The traditional switch 202 may be used to turn on or turn off the target device by opening or closing an electrical current loop to the power source 207. When a retrofit switch apparatus 21 is attached to the traditional switch device 202, the traditional switch 202 is covered in a containing space defined by a retrofit housing 212. A touch module 211 is connected to the retrofit housing 212 for receiving user touch operation and a wireless controller is used for controlling the target device 203. The wireless controller may be integrated with a touch driver to provide touch and control functions.

Figure 9:
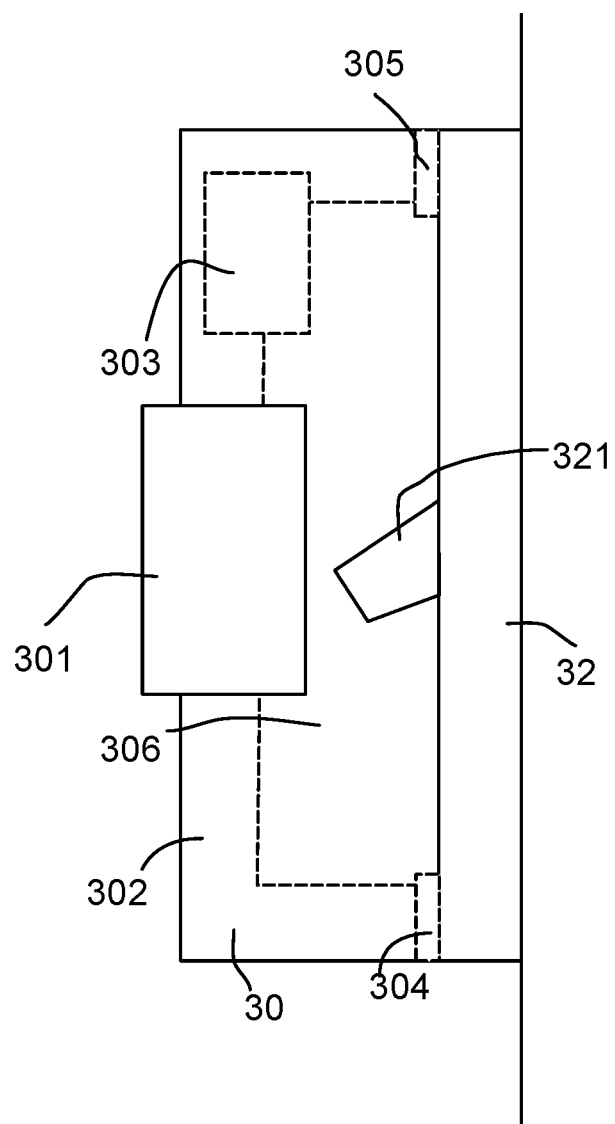
FIG. 9 illustrates a cross section view of a retrofit switch apparatus.

Please refer to FIG. 9, which illustrates an example of a retrofit switch apparatus 30 covering a traditional switch device 32. A traditional switch 321 is covered in a containing space 306 of the retrofit housing 302. A touch module 301 is connected to the retrofit housing 302. Related driver circuit and control circuit 303 may be placed aside, not right below the main body of touch module 301, e.g. under the touch surface of the touch module 301. Attaching devices 304, 305 are used to attaching the retrofit housing 302 to the traditional switch device 32.

Figure 10A:
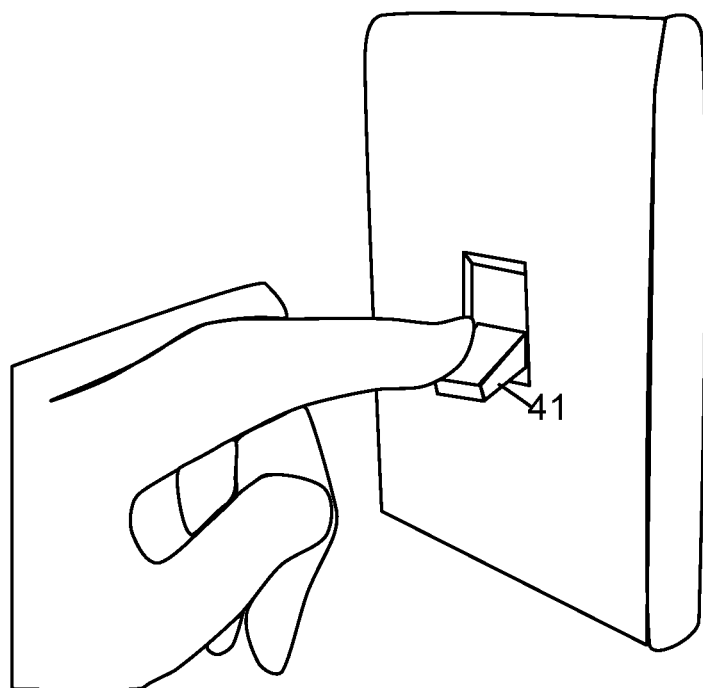
FIG. 10A and FIG. 10B illustrates use scenarios of a traditional switch device and a retrofit switch apparatus.
Figure 10B:
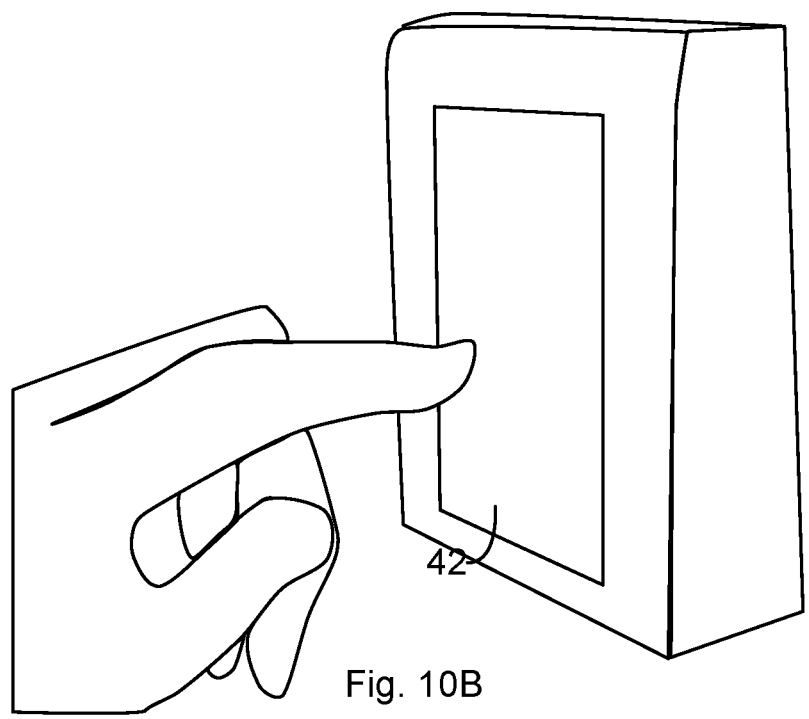

Please refer to FIG. 10A and FIG. 10B, which illustrate difference between operating a traditional switch 41 and operating a touch surface 42. In this example, when the retrofit switch apparatus is attached on the traditional switch device, the traditional switch is hidden from the user and would not be operated by accident.

There are various types of traditional switch devices in the market. Panel plates of some traditional switch devices may be replaced easily. In such case, a replacing plate with the connecting structure as mentioned here is sufficient to create a traditional switch device with the necessary structure to form the embodiments according to the present invention. For example, one or more holes, extruding plugs or other connecting structures may be placed on replacing panel plates to convert an old traditional switch device to a novel traditional switch device to be used in the present invention.

Figure 12:
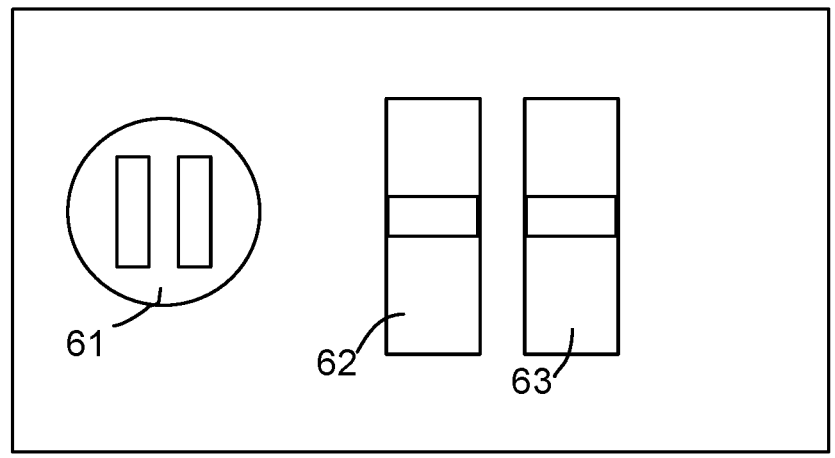
FIG. 12 illustrates a traditional switch device used in an embodiment of the present invention.
Figure 13:
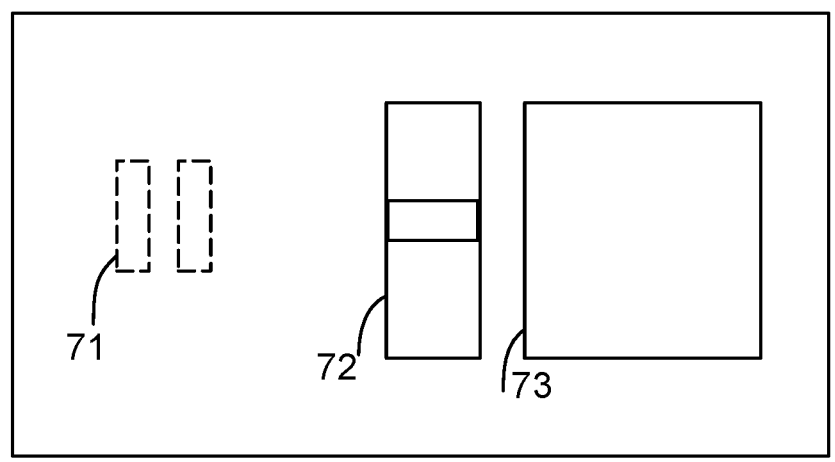
FIG. 13 illustrates a retrofit switch apparatus example.

Please refer to FIG. 12 and FIG. 13. FIG. 12 is a top view showing an example of a traditional switch device. In this example, in addition to two toggle switches 62, 63 as the traditional switches, a standard electrical socket 61 is also existed on the illustrated traditional switch device. FIG. 13 is a top view illustrating a corresponding retrofit switch apparatus having two protruding plugs 71 to be plugged into the standard electrical socket 61 for retrieving electrical power. In addition, when the retrofit switch apparatus is attached on the traditional switch device, the functions of the two traditional switches 62, 63 are now replaced by the two switches 72, 73 on the retrofit switch apparatus. In this example, it is illustrated that the appearance of the switches of the retrofit switch apparatus may not appear like the associated covered traditional switches.

In some embodiments, the connecting structure is a standard USB socket and the attaching device has a corresponding USB plug to plug into the standard USB socket. In other words, a regulated DC current is provided by the traditional switch device. This saves cost of the design of the retrofit switch apparatus.

In some embodiments, the connecting structure has a first hook structure and the attaching device is a second hook structure corresponding to the first hook structure for hooking the retrofit switch apparatus to the traditional switch device while remaining detachable connection relation. Various hook structures may be designed and all such variations including different pairing structures should be regarded within the invention scope. For example, plugs and associated grooves or sockets may be provided for forming such hook structures. Such hook structures may be designed so that users may easily take the retrofit switch apparatus away from the traditional switch device. Certain fixing level may also be applied to make it more difficult to un-hook the retrofit device from the traditional switch device.

In some embodiments, the retrofit housing exposes the traditional switch. Meanwhile, while the retrofit switch apparatus is connected to the traditional switch device, the traditional switch is disabled even when the traditional switch is operated by a user. The may be achieved by mechanical structure or electrical structure. For example, a sensor may be applied to detect existence of the retrofit switch apparatus. The function of the traditional switch may be disabled, i.e. not effect for operation thereof. Mechanical structures may be designed in the traditional switch device by physically triggering disabling function when the connecting device is attached with the attaching device.

In some embodiments, the attaching device changes operation mode of the traditional switch device to disable the traditional switch when the attaching device is connected to the traditional switch device.

In some embodiments, the traditional switch device may have a disabling switch to disable the traditional switch even when the traditional switch is operated by a user. For example, a toggle button may be disposed on the traditional switch device.

In some embodiments, the retrofit housing hides the traditional switch so that the traditional switch is not operated when the retrofit switch apparatus is connected to the traditional switch device. In other words, the retrofit housing prevents a user to touch the traditional switch so that to prevent accidently turning off power supply to the target device on which a control circuit may needs such power supply to work normally.

In some embodiments, the attaching device may have a rotating device for rotating the retrofit housing with respect to the traditional switch device. For example, a rotating hinge may be used for rotate the retrofit housing with respect to the traditional switch device. The attaching device may be a bracket fixed on the traditional switch device and contains an axis for connecting a portion of the retrofit housing so that a user may rotate the retrofit housing with respect to the traditional switch device.

With such design, the retrofit switch device may have a battery box. When the retrofit housing is rotated with respect to the traditional switch device, the battery box is facing to a user for the user to replace a battery in the battery box.

With such design, when the retrofit housing is rotated with respect to the traditional switch device, the traditional switch may be exposed to a user for the user to operate the traditional switch. This is very important because with such design, a user may easily operate the traditional switch in accident scenario, in the case which a user wants to replace a bulb of the target device, or in the case that the retrofit switch apparatus functions abnormally.

Figure 11:
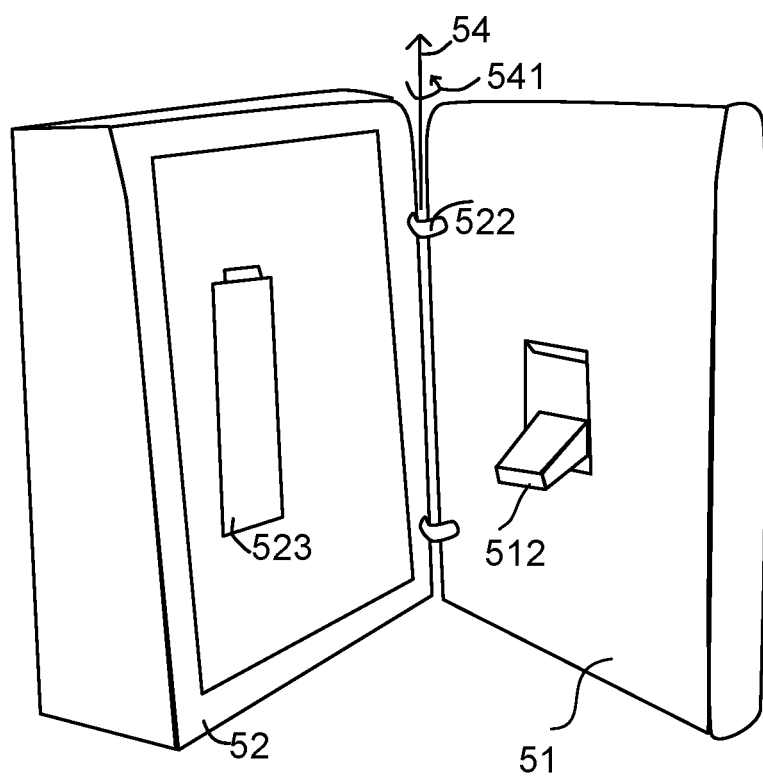
FIG. 11 illustrates a retrofit switch apparatus rotated with respect to a traditional switch device.

Please refer to FIG. 11, which illustrates a diagram in which a retrofit switch apparatus 52 is rotated with respect to a traditional switch device 51. The retrofit switch 52 has an attaching device 522 that defines a rotating axis 54. When the retrofit switch 52 is rotated with respect to the traditional switch apparatus 51 along the rotation direction 541, the traditional switch 512 may be exposed to be used again. In addition, a battery box of the retrofit switch apparatus 52 may be exposed and user may replace a battery 523 to power the wireless controller of the retrofit switch apparatus 52.

In some embodiments, the traditional switch cover surface has a standard electrical socket and the attaching device has a standard electrical plug to plug into the standard electrical socket. It is common to find such traditional switch in various houses. Or ore two light switches together with one or two standard electrical sockets are integrated as a traditional switch device placed on a wall. In such case, the retrofit switch apparatus is plugged into the electrical socket to attach the retrofit switch apparatus overlapping and covering the original traditional switch on the wall. Meanwhile, the retrofit switch apparatus may include an external standard electrical socket exposed on the retrofit housing for forwarding electrical power from the standard electrical socket of the traditional switch device. In other words, the retrofit switch device may get power supply from the electrical socket and may simply forwards the electrical power to another device plugging into the electrical socket on the retrofit switch apparatus.

In some embodiments, the control circuit is embedded in a control module. The control module is separable from the main body of the retrofit housing. For example, a reception hole is disposed for receiving the control module. With such design, manufacturers may produce the same control modules while pairing such control modules to different retrofit housings to fit different traditional switch device types. Such design saves a lot of manufacturing cost while keeping strong flexibility.

In some embodiments, the control module may include a touch surface for receiving a touch operation from a user to operate the control circuit. For example, variable types of capacitor or resistor touch devices may be used in such embodiments.

In some embodiments, the control module may be disposed with electrical connectors to be connected to a corresponding structure on the retrofit housing to receive power supply from a battery or from the traditional switch device.

Another aspect of the present invention is to provide a traditional switch apparatus for connecting to the retrofit switch apparatuses mentioned above. Such traditional switch apparatus has a similar appearance like convention switch device but new features as mentioned above. Such traditional switch apparatus has a traditional switch and a connecting structure for connecting to the attaching device of the retrofit switch apparatus as mentioned above.

In some embodiments, the connecting structure may even supply electrical power to the control circuit of the retrofit switch apparatus.

Figure 15A:
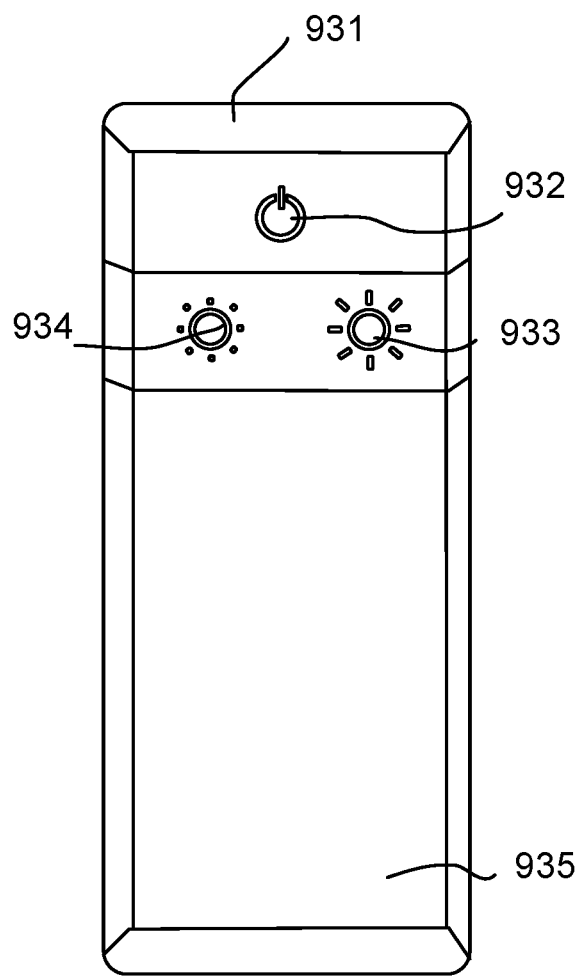
FIG. 15A and FIG. 15B illustrate two views of another embodiment.
Figure 15B:
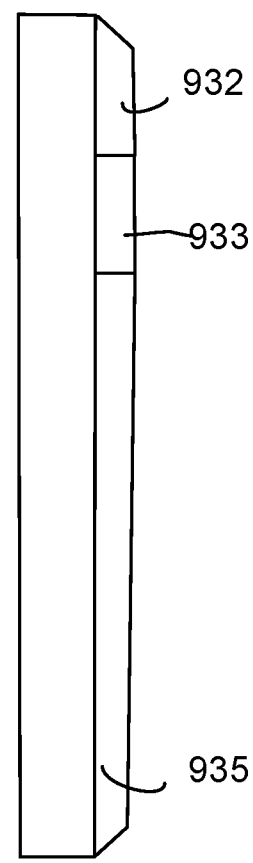
Figure 16:
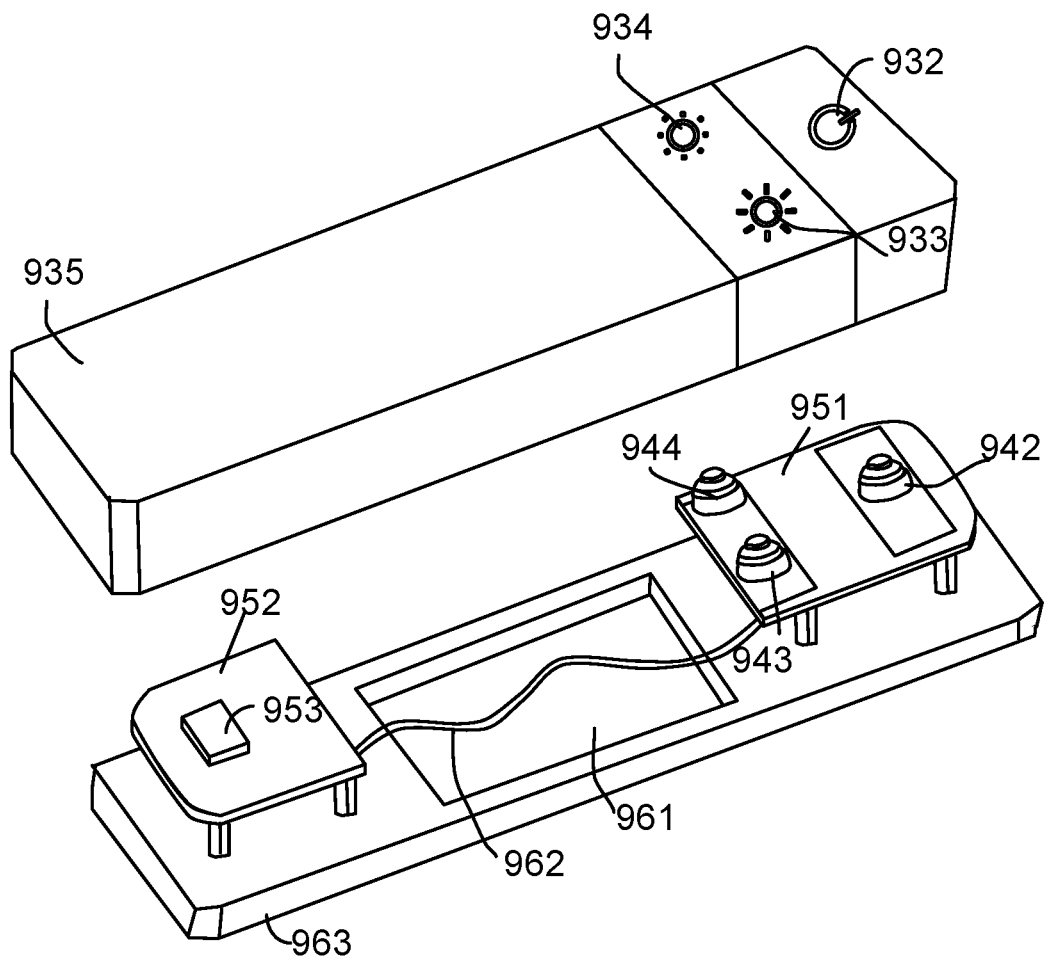
FIG. 16 illustrates an exploded view of the embodiment of FIG. 15A.

Please refer to FIG. 15A, FIG. 15B and FIG. 16, which illustrates another embodiment according to the present invention.

In this embodiment, the retrofit switch apparatus has a ON/OFF button 932 and two brightness adjustment buttons 933, 934. The ON/OFF button 932 and two brightness adjustment buttons 933, 934 are used for turning on/off and adjusting brightness of the target device like a bulb.

In this embodiment, two circuit board 951, 952 are disposed. The circuit board 951 is for supporting button components 942, 943, 944 for receiving operation from the ON/OFF button 932 and two brightness adjustment buttons 933, 934. The operations are converted to signals and transmitted to a wireless controller 953 located on the circuit board 952 via a wire 962.

The two circuit boards 951, 952 are fixed on a bracket 963 to be attached to a traditional switch device as mentioned above. There is a hole 961 for a traditional switch to be entered and covered by the retrofit switch apparatus. Please be noted that the ON/OFF button 932 and two brightness adjustment buttons 933, 934 and their associated structures are far away from the wireless controller 953, which is at an opposite end 935 of the retrofit switch apparatus. Other configuration of buttons, of course, are also covered by the present invention and may be changed by persons of ordinary skill in the art in light of this specification.

It is to be understood that the forms of the invention shown are preferred embodiments thereof and that various changes and modifications may be made therein without departing from the spirit of the invention or scope as defined in the following claims.

The invention claimed is:

1. A light device control apparatus for controlling a light device, comprising:
   a cover body having a storing space for containing and covering a traditional switch device to keep the traditional switch in a default operation mode, the traditional switch device having a traditional switch and a traditional switch surface cover, the traditional switch device being used for receiving a first user manual operation to control a target device connected to the traditional switch device via an electrical wire;
   a replacement switch disposed at a first end of the cover body, the replacement switch receiving a second user manual operation; and
   a wireless controller disposed at a second end of the cover body, the wireless controller electrically connected to the replacement switch for converting the second user operation to a wireless control command to control the target device.

2. The light device control apparatus of claim 1, wherein the first end where the replacement switch is disposed and the second end where the replacement switch is disposed are at opposite ends of the cover body.

3. The light device control apparatus of claim 1, wherein the first end where the replacement switch is disposed is at center portion of the cover body, and the second where the replacement switch is disposed is at peripheral area with respect to center portion of the cover body.

4. The light device control apparatus of claim 1, wherein the replacement switch has two buttons respectively located at two opposing peripheral areas of the cover body and the wireless controller is located in the central portion of the cover body.

5. The light device control apparatus of claim 1, wherein the replacement switch has a mechanical switch connected to the wireless controller with a signal line.

6. The light device control apparatus of claim 5, wherein the replacement switch has a switch circuit for converting the second user manual operation to an electrical signal transmitted to the wireless controller via the signal line.

7. The light device control apparatus of claim 1, wherein the wireless controller has a module housing to be integrated to the cover body and the wireless controller is detachable from the cover body so that the wireless controller with the same module housing matches to different sizes and types of the cover bodies corresponding to different traditional switch devices.

8. The light device control apparatus claim 7, wherein the cover body has a slot for receiving the module housing, and the slot is arranged horizontally neighboring to the replacement switch with respect to the environment surface instead of overlapping with the replacement switch vertically.

9. The light device control apparatus of claim 1, wherein the replacement switch is arranged horizontally neighboring to the wireless controller with respect to the environment instead of overlapping to the wireless controller vertically.

10. The light device control apparatus of claim 1, wherein the cover body has a bottom part and a top part, the replacement switch is disposed at the top part and the bottom part is attached to the traditional switch surface cover, the bottom part has a plurality of supporting walls defining the storing space for covering the traditional switch and for keeping the traditional switch not operated by a user when the traditional switch is covered in the storing space.

11. The light device control apparatus of claim 10, wherein the replacement switch has a light guide component to detect the second user manual operation, a sensor is used with the light guide component to convert the second user manual operation to the wireless controller to control the target device.

12. The light device control apparatus of claim 11, wherein the replacement switch has two buttons corresponding two operation modes of the target device, and the two buttons change a status of the light guide component when the two buttons are pressed.

13. The light device control apparatus of claim 10, wherein the replacement switch has a silicon dioxide component to detect the second user manual operation, a decoder is used with the silicon dioxide component to convert the second user manual operation to the wireless controller to control the target device.

14. The light device control apparatus of claim 11, wherein the replacement switch has two buttons corresponding two operation modes of the target device, and the two buttons correspond to two silicon dioxide components to generate signals corresponding associated to the second user manual operations when the two buttons are pressed.

15. The light device control apparatus of claim 10, further comprising a circuit board for supporting the wireless controller and a switch circuit arranged horizontally with respect to the environment surface and without overlapping with each other.

16. The light device control apparatus of claim 15, wherein there is a hole in the middle of the circuit board so that a portion of the traditional switch extends through the hole of the circuit board.

17. The light device control apparatus of claim 1, further comprising a hinge between the top part and the bottom part so that the top part is operable to be rotated with respect with the bottom part to change a battery of the wireless controller.

18. The light device control apparatus of claim 17, wherein when the top part is rotated, the traditional switch is exposed to a user so that the user is able to control the traditional switch.

19. The light device control apparatus of claim 1, wherein the wireless controller is electrically disconnected from the traditional switch device.

20. The light device control apparatus of claim 1, wherein the traditional switch device has a mode switch and when the retrofit switch apparatus is attached to the traditional device, the mode switch is activated so that the target device is kept supplied with electricity via the traditional switch device.

* * * * *